United States Patent
Kawasaki et al.

(10) Patent No.: US 7,723,751 B2
(45) Date of Patent: May 25, 2010

(54) SEMICONDUCTOR DEVICE AND FABRICATION METHOD OF THE SAME

(75) Inventors: Takeshi Kawasaki, Yamanashi (JP);
Ken Nakata, Yamanashi (JP); Seiji Yaegashi, Yamanashi (JP)

(73) Assignee: Eudyna Devices Inc., Yamanashi (JP)

( * ) Notice: Subject to any disclaimer, the term of this patent is extended or adjusted under 35 U.S.C. 154(b) by 287 days.

(21) Appl. No.: 11/392,517

(22) Filed: Mar. 30, 2006

(65) Prior Publication Data

US 2006/0219997 A1    Oct. 5, 2006

(30) Foreign Application Priority Data

Mar. 31, 2005  (JP)  ............... 2005-104512

(51) Int. Cl.
*H01L 29/38* (2006.01)
*H01L 31/0328* (2006.01)
*H01L 31/0336* (2006.01)
*H01L 31/072* (2006.01)
*H01L 31/109* (2006.01)

(52) U.S. Cl. .................. 257/194; 257/192; 257/330; 257/E21.22; 257/E21.407; 257/E29.246

(58) Field of Classification Search .............. 257/79, 257/92, 94, 103, 81, 192, 194, 12, 330, E21.22, 257/E21.407, E29.246
See application file for complete search history.

(56) References Cited

U.S. PATENT DOCUMENTS

| | | | |
|---|---|---|---|
| 5,406,094 A * | 4/1995 | Arimoto et al. ............ 257/24 |
| 5,557,115 A * | 9/1996 | Shakuda .................. 257/81 |
| 5,877,047 A | 3/1999 | Weitzel et al. |
| 5,977,564 A | 11/1999 | Kobayashi et al. |
| 7,098,093 B2 * | 8/2006 | Clarke et al. ............. 438/172 |
| 7,592,647 B2 * | 9/2009 | Nakata et al. ............. 257/194 |
| 2001/0040246 A1 * | 11/2001 | Ishii ....................... 257/192 |
| 2005/0023555 A1 * | 2/2005 | Yoshida et al. ............ 257/192 |
| 2005/0181536 A1 * | 8/2005 | Tsuji ...................... 438/105 |
| 2006/0091430 A1 * | 5/2006 | Sriram et al. ............. 257/280 |
| 2006/0118824 A1 * | 6/2006 | Otsuka et al. ............. 257/194 |
| 2006/0220042 A1 * | 10/2006 | Yaegashi et al. ........... 257/94 |

FOREIGN PATENT DOCUMENTS

| | | | |
|---|---|---|---|
| JP | 2004-165520 A | 6/2004 |
| WO | 98/37584 A1 | 8/1998 |
| WO | WO 2005024955 A1 * | 3/2005 |

OTHER PUBLICATIONS

European Search Report dated Apr. 28, 2008, issued in corresponding European Patent Application No. 06251774.

* cited by examiner

*Primary Examiner*—Zandra Smith
*Assistant Examiner*—Telly D Green
(74) *Attorney, Agent, or Firm*—Westerman, Hattori, Daniels & Adrian, LLP

(57) ABSTRACT

A semiconductor device includes a substrate, a SiC drift layer formed above the substrate, a GaN-based semiconductor layer that is formed on the SiC drift layer and includes a channel layer, a source electrode and a gate electrode formed on the GaN-based semiconductor layer, current blocking regions formed in portions of the SiC drift layer and located below the source and gate electrodes, and a drain electrode formed on a surface that opposes the GaN-based semiconductor layer across the SiC layer.

2 Claims, 9 Drawing Sheets

SEMICONDUCTOR DEVICE AND FABRICATION METHOD OF THE SAME

BACKGROUND OF THE INVENTION

1. Field of the Invention

The present invention generally relates to semiconductor devices and fabrication methods of the same, and more particularly, to a power control transistor having a vertical structure and a method of fabricating the same.

2. Description of the Related Art

The power control transistors are widely used in various fields such as home electric appliances, electric railways, electric automobiles and electric power. The power control transistors are required to have high breakdown capability such that dielectric breakdown does not take place even if high power is applied. The power control transistors are also required to have a small on-state resistance in order to realize low insertion loss. Recently, transistors having a vertical structure have had a great deal of attention as power control transistors.

FIG. 1 is a cross-sectional view of a Si-based vertical type MOSFET (hereinafter referred to as first prior art). An n-type SiC buffer layer 12 and n-type SiC channel layer 14 are laminated on an n-type SiC substrate 10 in this order. A gate oxide film 54 is formed on the channel layer 14, and a gate electrode 62 is provided on the gate oxide film 54. Source electrodes 62 are provided on opposing sides of the gate electrode 60. N-type regions 52 are respectively provided below the source electrodes 60, and are surrounded by p-type regions 50. A drain electrode (not shown) is provided on the backside of the SiC substrate 10.

Japanese Patent Application Publication No. 2004-165520 discloses, in FIG. 1, a vertical FET using a GaN-based semiconductor (hereinafter referred to as second prior art). On a substrate, laminated are an undoped GaN layer, an n-type GaN drain layer, an n-type GaN channel layer, and an n-type GaN source layer in this order. An opening that reaches the drain layer is provided in a given region, and an insulating film is provided on a sidewall of the opening. A gate electrode is provided an insulating film on the channel layer. A source electrode and a drain electrode are respectively provided for the source layer and the drain layer.

However, the first prior art has a problem such that the SiC channel layer realizes a mobility of only tens of cmV/s and the resultant on-state resistance. is as low as tens of mΩ/cm². The second prior art has a problem such that high breakdown voltage cannot be achieved-because the drain electrode is connected to the drain layer. If it is attempted to arrange the drain electrode on the backside of the substrate for improvement in breakdown, the substrate may be a GaN substrate, which has lattice match with the GaN layer. However, the GaN substrate is very expensive and has a difficulty in enlarging the size. For a substrate that does not have lattice match with the GaN layer, GaN cannot be grown to form a thick film, and high breakdown cannot be achieved.

SUMMARY OF THE INVENTION

The present invention has been made in view of the above circumstances, and has an object to provide a semiconductor device having a high breakdown capability and a low on-state resistance.

According to an aspect of the present invention, there is provided a semiconductor device including: a substrate; a SiC drift layer formed above the substrate; a GaN-based semiconductor layer that is formed on the SiC drift layer and includes a channel layer; a source electrode and a gate electrode formed on the GaN-based semiconductor layer; current blocking regions formed in portions of the SiC drift layer and located below the source and gate electrodes; and a drain electrode formed on a surface that opposes the GaN-based semiconductor layer across the SiC layer.

According to another aspect of the present invention, there is provided a semiconductor device including: a substrate; a SiC drift layer formed above the substrate and composed of a p-type SiC layer, the SiC drift layer having an opening region deeper than the SiC drift layer; a GaN-based semiconductor layer formed on the SiC drift layer; a source or emitter electrode and a gate electrode formed on the GaN-based semiconductor layer; and a drain electrode or a collector electrode formed on a surface that opposes the GaN-based semiconductor layer across the SiC layer.

According to yet another aspect of the present invention, there is provided a semiconductor device including: a substrate; a SiC drift layer formed above the substrate; a GaN-based semiconductor layer that is formed on the SiC drift layer, and includes a channel layer and an opening region deeper than the channel layer; a cap layer that is formed on a side surface of the channel layer in the opening region and has a band gap wider than that of the channel layer; a gate electrode formed on the cap layer and located in the opening region; a source or emitter electrode formed on the GaN-based semiconductor layer; and a drain electrode or a collector electrode formed on a surface that opposes the GaN-based semiconductor layer across the SiC layer.

According to a further aspect of the present invention, there is provided a method of fabricating a semiconductor device including: forming a SiC drift layer on a substrate; forming p-type SiC regions in the SiC drift layer; forming a GaN-based semiconductor layer on the SiC drift layer; forming gate electrodes on the GaN-based semiconductor layer so as to be located above the p-type SiC regions; forming source electrodes on the GaN-based semiconductor layer so as to be located above the p-type SiC regions; and forming a drain electrode formed on a surface that opposes the GaN-based semiconductor layer across the SiC layer.

According to a still further aspect of the present invention, there is provided a method of fabricating a semiconductor device including: forming a SiC drift layer including p-type SiC layer on a substrate; forming an opening region in the SiC drift layer by removing at least the p-type SiC layer; forming a GaN-based semiconductor layer on the SiC drift layer including the opening region; forming gate electrodes on the p-type SiC layer of the GaN-based semiconductor layer; forming source or emitter electrodes on the p-type SiC layer of the GaN-based semiconductor layer; and forming a drain electrode or a collector electrode formed on a surface that opposes the GaN-based semiconductor layer across the SiC layer.

According to another aspect of the present invention, there is provided a method of fabricating a semiconductor device including: forming a SiC drift layer on a substrate; forming a GaN-based semiconductor layer including a channel layer on the SiC drift layer; forming an opening region in the GaN-based semiconductor layer by removing at least the channel layer; forming a cap layer on a side surface of the channel layer in the opening region; forming a gate electrode above the side surface of the channel layer through the cap layer in the opening region; forming a source or emitter electrode on the GaN-based semiconductor layer; and forming a drain electrode or a collector electrode formed on a surface that opposes the GaN-based semiconductor layer across the SiC layer.

BRIEF DESCRIPTION OF THE DRAWINGS

Preferred embodiments of the present invention will be described in detail based on the following figures, in which.

PREFERRED EMBODIMENTS OF THE PRESENT INVENTION

It is to be noted that SiC has high dielectric breakdown and is therefore a material for improvement in breakdown capability. The first prior art that employs SiC cannot realize a high mobility and thus cannot realize a low on-state resistance. This is because the interface between the SiC channel layer 14 and the gate electrode 54 has a high density of the interfacial level. SiC differs from an element semiconductor such as Si in that SiC has not only Si atoms but also C atoms. It is thus difficult to form a silicon oxide film in an order of one or two atoms due to thermal oxidization. Therefore, a silicon oxide film having a good quality is not expected. Consequently, it is difficult to reduce the density of the interfacial level between the SiC layer and the silicon oxide film to $1 \times 10^{11}$ cm$^{-2}$, which density is required to form an inversion layer having a high mobility.

According to an aspect of the present invention, a semiconductor device is equipped with a SiC drift layer and a GaN-based semiconductor layer provided on the SiC drift layer in order to improve both the breakdown capability and the on-state resistance.

First Embodiment

Figure 1:
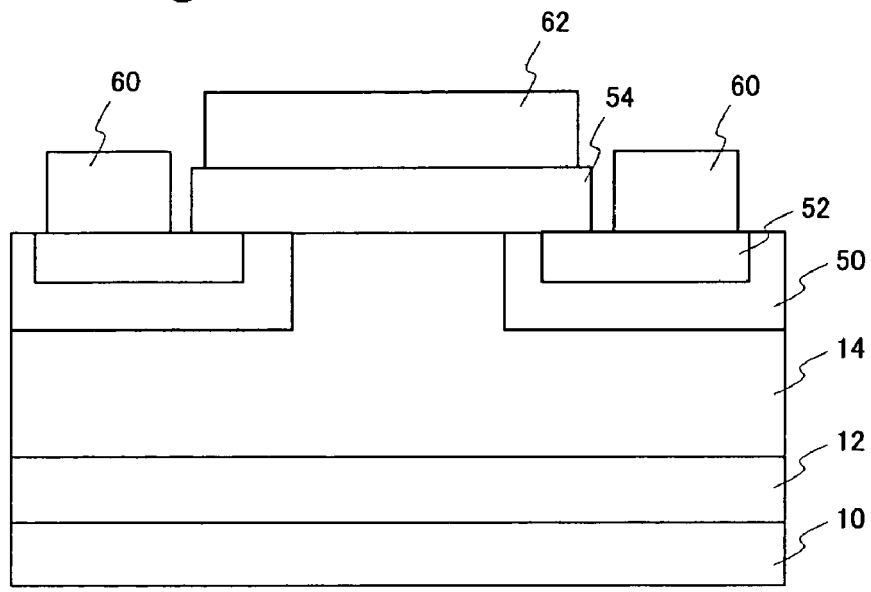
FIG. 1 is a cross-sectional view of a conventional transistor.
Figure 2:
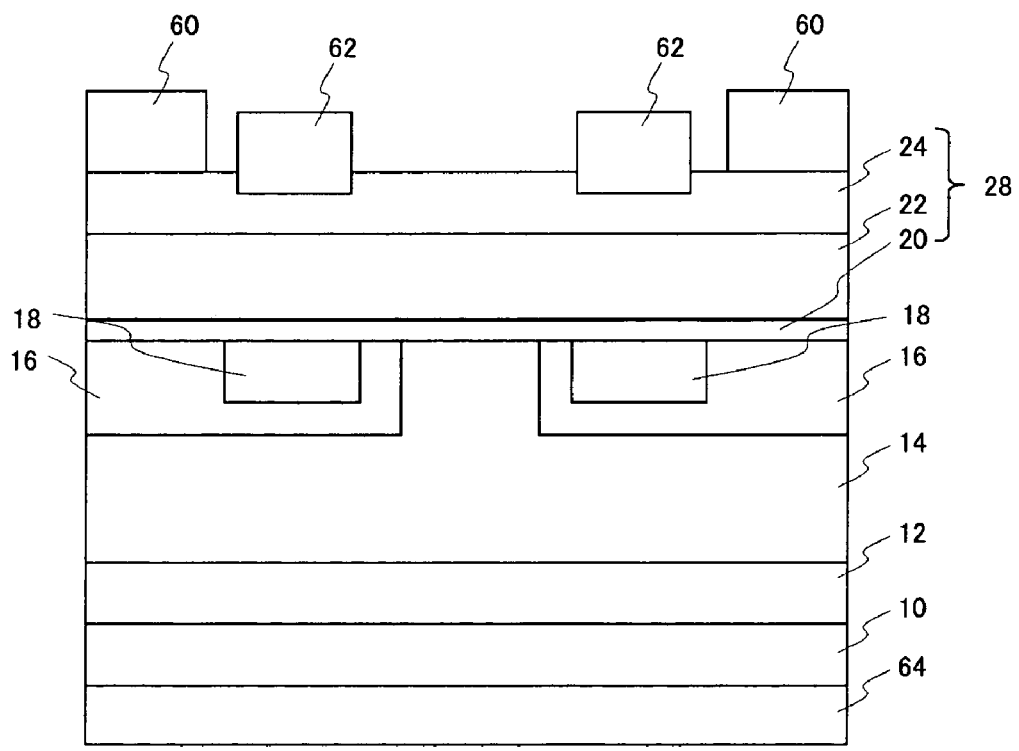
FIG. 2 is a cross-sectional view of a semiconductor device in accordance with a first embodiment of the present invention.

FIG. 2 is a cross-sectional view of a transistor in accordance with a first embodiment of the present invention. This transistor is a vertical type FET (HEMT: High Electron Mobility Transistor). The aforementioned n-type SiC buffer layer 12 and the n-type SiC drift layer 14 are formed on a (0001) plane of the n-type SiC substrate 10 in this order. Further, an n-type AlGaN layer 20, a GaN channel layer 22 and an AlGaN cap layer 24 are grown as a GaN-based semiconductor layer 28. The source electrodes 60 are formed on the cap layer 24, and gate electrodes 62 are partially buried in the cap layer 24. P-type SiC regions 16 are provided in the drift layer 14 below the gate electrodes 62, and highly doped p-type SiC regions 18 are provided in the drift layer 14. A drain electrode 64 is provided on the backside of the SiC substrate 10. That is, the drain electrode 64 is formed on a surface that opposes the GaN-based semiconductor layer across the SiC layer. The transistor of the first embodiment is configured as described above.

Figure 3:
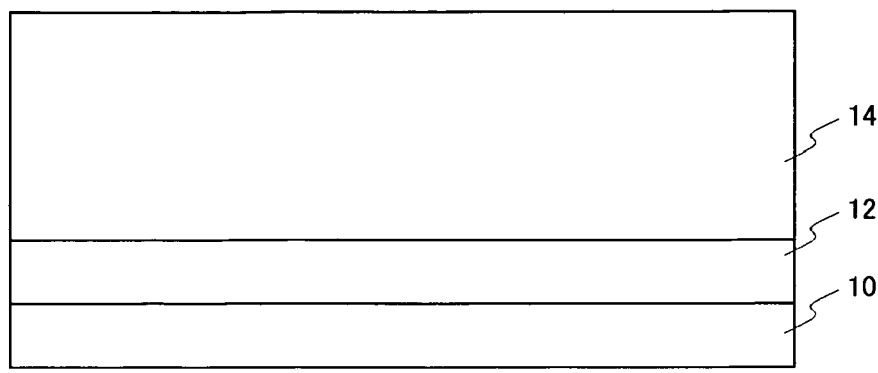
FIG. 3 is a cross-sectional view showing a fabrication process of the semiconductor device in accordance with the first embodiment.

FIGS. 3 through 7 are respectively cross-sectional views that show a process of fabricating the transistor in accordance with the first embodiment. Referring to FIG. 3, the SiC substrate 10 is prepared which has a film thickness of 400 μm and an n-type carrier concentration of $10 \times 10^{19}$ cm$^{-3}$. The SiC buffer layer 12 having a film thickness of 200 nm and an n-type carrier concentration of $10 \times 10^{19}$ cm$^{-3}$ is formed on the SiC substrate 10 by CVD. The SiC drift layer 14 having a film thickness of 10 μm and an n-type carrier concentration of $10 \times 10^{16}$ cm$^{-3}$ is formed on the SiC buffer layer 12 by CVD.

Figure 4:
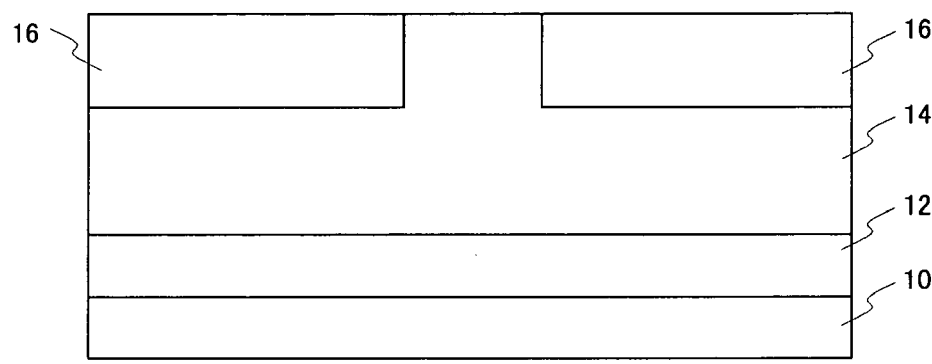
FIG. 4 is a cross-sectional view showing a fabrication process that follows the process shown in FIG. 3.

Referring to FIG. 4, Al ions are implanted in regions of the SiC drift layer 14 located below the source electrodes 60 and the gate electrodes 62 to be formed later so as to form the p-type SiC regions 16 having a film thickness of 200 nm and a p-type carrier concentration of $10 \times 10^{16}$ cm$^{-3}$.

Figure 5:
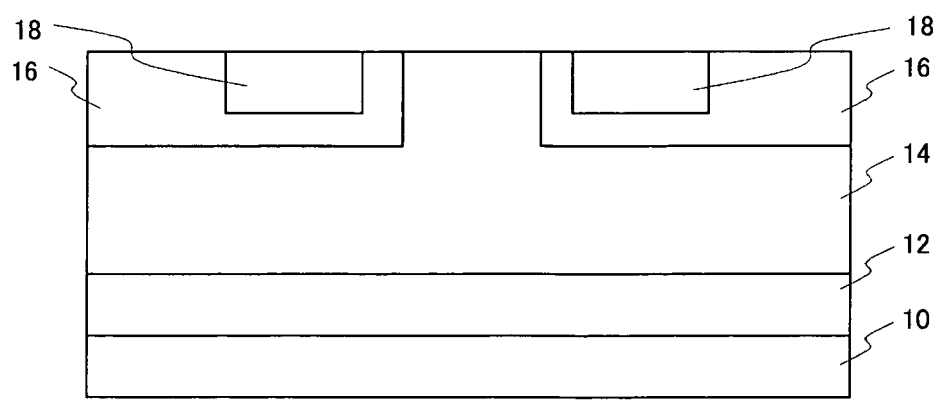
FIG. 5 is a cross-sectional view showing a fabrication process that follows the process shown in FIG. 4.

Referring to FIG. 5, Al ions are implanted in regions of the SiC regions 16 (in other words, the SiC drift layer 14) located below the gate electrodes to be formed later so as to form the highly doped p-type SiC regions 18 having a film thickness of 100 nm and a p-type carrier concentration of $10 \times 10^{19}$ cm$^{-3}$.

Figure 6:
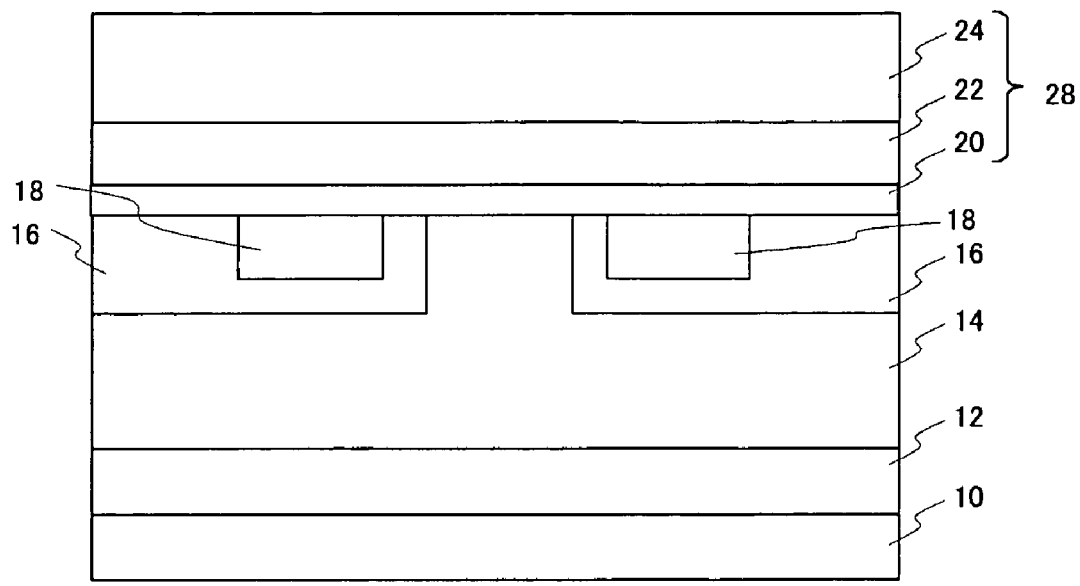
FIG. 6 is a cross-sectional view showing a fabrication process that follows the process shown in FIG. 5.

Referring to FIG. 6, the n-type AlGaN layer 20 (having an AlN composition ratio of 0.09), which is a part of the GaN-based semiconductor layer 28, is formed on the drift layer 14 so that it has a film thickness of 20 nm and an n-type carrier concentration of $10 \times 10^{18}$ cm$^{-3}$ by, for example, MOCVD. The GaN channel layer 22, which is another part of the GaN-based semiconductor layer 28 and has no impurities implanted is grown to a film thickness of 500 nm on the AlGaN layer 20 by MOCVD. Further, the AlGaN cap layer 24 (having an AlN composition ratio of 0.25), which is yet another part of the GaN-based semiconductor layer 28, is grown to a film thickness of 20 nm on the GaN channel layer 22 by MOCVD.

Figure 7:
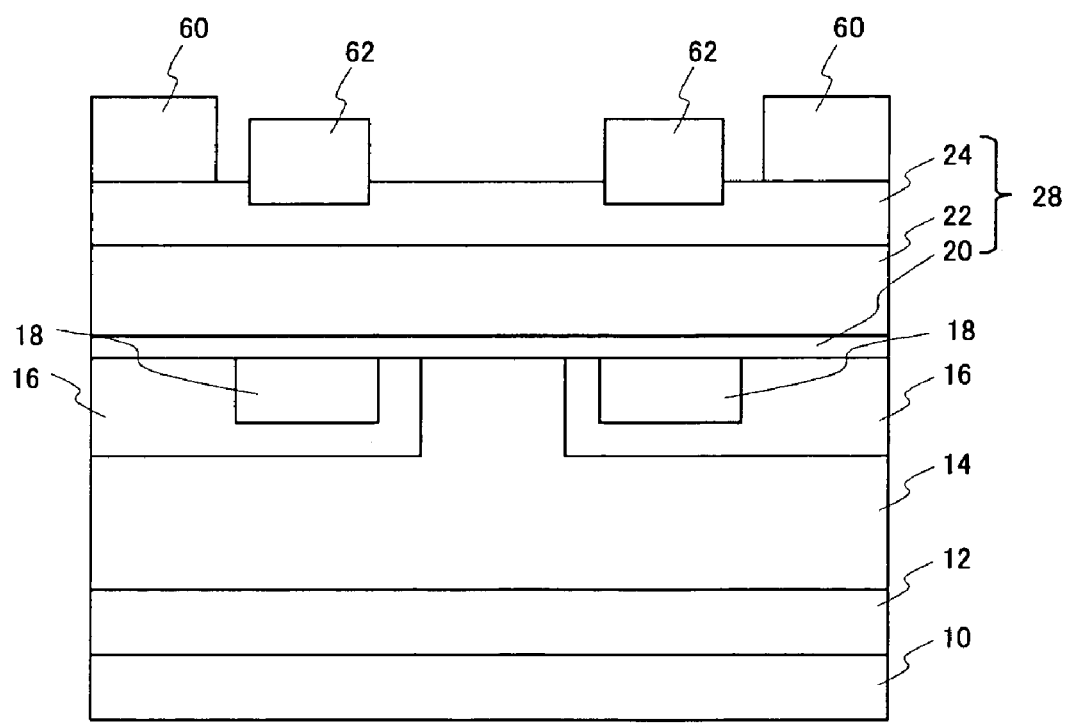
FIG. 7 is a cross-sectional view showing a fabrication process that follows the process shown in FIG. 6.

Referring to FIG. 7, the given regions of the cap layer 24 are dry-etched by 10 nm with a Cl$_2$ gas, so that recesses are formed. The source electrodes 60 made of, for example, Ti/Al, are formed at given position on the cap layer 24, and the gate electrodes 62 made of, for example, Ni/Au, are formed in the recesses.

After the SiC substrate 10 is grinded so as to have a thickness of 100 μm, the drain electrode 64 made of, for example, Ni/Al is formed on the backside of the SiC substrate 10. The drain electrode is connected to the surface of the drift layer 14 opposite to the surface thereof to which the GaN-based semiconductor layer 28 is coupled. The above-mentioned process produces the transistor of the first embodiment shown in FIG. 2.

In the transistor shown in FIG. 2, electros from the source electrodes 60 transversally travel through the channel layer 22, and pass through a passage defined between the p-type SiC regions 16, finally reaching the drain electrode 64. The electrons traveling through the channel layer 22 are controlled by the gate electrodes 62, so that the transistor operation can be implemented. It is to be noted that the drift layer 14 is made of SiC. SiC has a breakdown capability that is approximately ten times greater than that of Si and can be grown to form a thick film. It is thus possible to increase the film thickness of the SiC drift layer 14 and realize the transistor with a higher drain breakdown voltage. The SiC drift layer 14 employed in the first embodiment is 10 µm thick. When the SiC drift layer 14 has a film thickness equal to or greater than 1 µm, the drain breakdown voltage can be improved. When the SiC drift layer 14 is 100 µm thick or less, it can be used practically. It is difficult to form the GaN-based semiconductor layer to a film thickness of 3 µm or more for the SiC substrate or Si substrate because lattice match is not available. Particularly, as the wafer has a larger size, it becomes more difficult to grow the GaN-based semiconductor layer to form a thick film. According to the present invention, the drift layer is made of SiC. It is thus possible to form the drift layer as thick as 1 µm or more even when the wafer has a larger size. Thus, the transistor having a higher drain breakdown voltage can be realized.

The present invention has another advantage. GaN that forms the channel layer 22 has a high mobility than that of Si and achieves a lower on-state resistance. The interfacial level that occurs at the interface between the channel layer 22 and the cap layer 24 is extremely low and electros at the interface form a 2DEG. It is thus possible to realize an extremely high mobility.

The p-type SiC regions 16 function as current blocking regions or barriers that prevents electrons from directly flowing to the drain electrodes 64 from the source electrodes 60. The p-type SiC regions 16 are in contact with the GaN-based semiconductor layer 28. This allows the p-type SiC regions 16 to be arranged close to the channel layer 22 and further improves the pinchoff characteristic. The highly doped p-type SiC regions 18 located below the gate electrodes 62 contribute to improvement in the pinchoff characteristic.

The AlGaN layer 20 is not essential but optional. However, it is preferable to use the AlGaN layer 20 that can easily be grown on the SiC film because there is a difficulty in growing the GaN film directly on the SiC film.

As described above, the semiconductor device in accordance the first embodiment is characterized in that the higher breakdown capability can be realized by using the SiC drift layer 14, and the on-state resistance can be reduced because electrons travel through the channel layer 22 that is a part of the GaN-based semiconductor layer 28.

Second Embodiment

Figure 8:
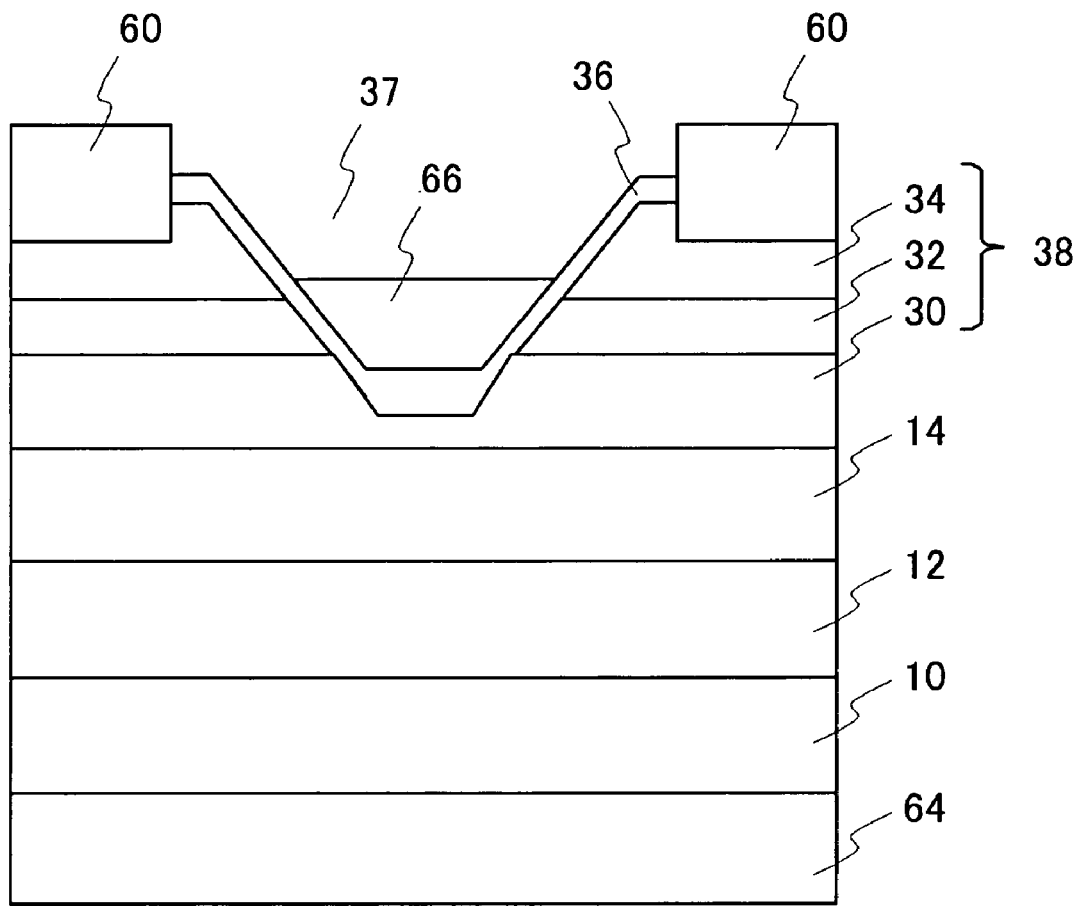
FIG. 8 is a cross-sectional view of a semiconductor device in accordance with a second embodiment of the present invention.

FIG. 8 is a cross-sectional view of a transistor in accordance with a second embodiment of the present invention. This transistor is a vertical type FET (HEMT). The n-type SiC buffer layer 12 and then-type SiC drift layer 14 are formed on the (0001) plane of the n-type SiC substrate 10 in this order. As the GaN-based semiconductor layer 38, an n-type AlGaN drain layer 30, a p-type GaN channel layer (p-type GaN-based semiconductor layer) 32, and an AlGaN source layer 34. An opening region 37 is formed so as to reach the AlGaN drain layer 30 from the device surface. The opening region 37 is essentially deeper than the p-type channel layer 32.

An AlN cap layer 36 is formed so as to cover the opening region 37. Gate electrodes 60 are formed on the cap layer 36, and the source electrodes 60 are on the cap layer 36, namely, the GaN-based semiconductor layer 38. The cap layer 36 having a wider band gap than that of the channel layer 32 is arranged on the side surface of the channel layer 32 in the opening region 37, and the gate electrode 66 is provided above the side surface of the channel layer 32 through the cap layer 36 in the opening region 37. The drain electrode 64 is provided on the backside of the SiC substrate 10. That is, the drain electrode 64 is connected to the surface of the drift layer 14 that opposes the GaN-based semiconductor layer 38 across the drift layer 14.

Figure 9:
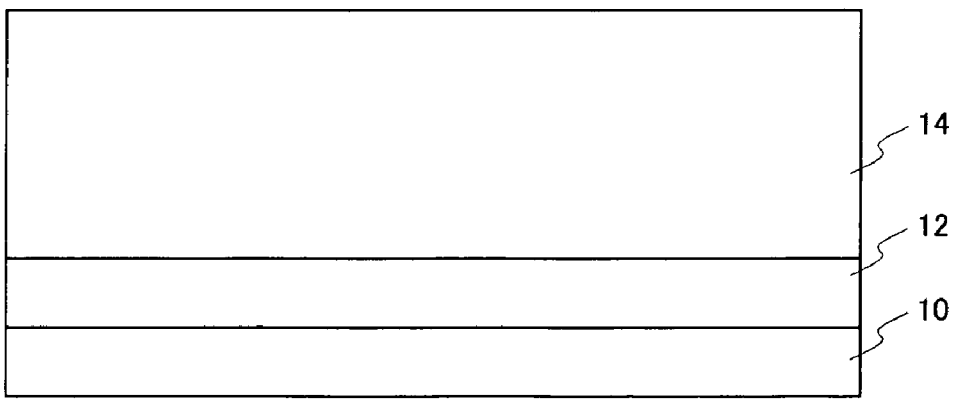
FIG. 9 is a cross-sectional view showing a fabrication process of the semiconductor device in accordance with the second embodiment.

FIGS. 9 through 12 are respectively cross-sectional views that show a process of fabricating the transistor in accordance with the second embodiments. Referring to FIG. 9, the SiC buffer layer 12 and the SiC drift layer 14 are formed on the SiC substrate 10 in this order by CVD.

Figure 10:
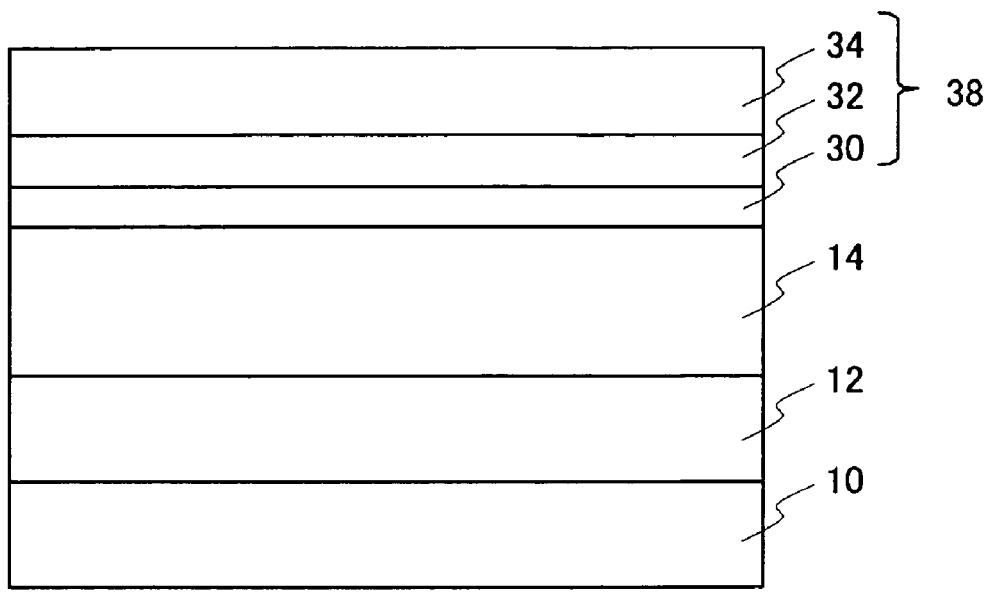
FIG. 10 is a cross-sectional view showing a fabrication process that follows the process shown in FIG. 9.

Referring to FIG. 10, the GaN-based semiconductor layer 38 is formed as follows. The n-type AlGaN layer 30 (having an AlN composition ratio of 0.09), which is a part of the GaN-based semiconductor layer 38, is formed on the drift layer 14 so that it has a film thickness of 100 nm and an n-type carrier concentration of $10 \times 10^{16}$ cm$^{-3}$ by, for example, MOCVD. The GaN channel layer 32, which is another part of the GaN-based semiconductor layer 38 and has a p-type carrier concentration of $10 \times 10^{16}$ cm$^{-3}$ is grown to a film thickness of 100 nm on the AlGaN layer 30 by MOCVD. Further, the AlGaN cap layer 34 (having an AlN composition ratio of 0.25), which is yet another part of the GaN-based semiconductor layer 38, is grown to a film thickness of 100 nm on the GaN channel layer 32 by MOCVD.

Figure 11:
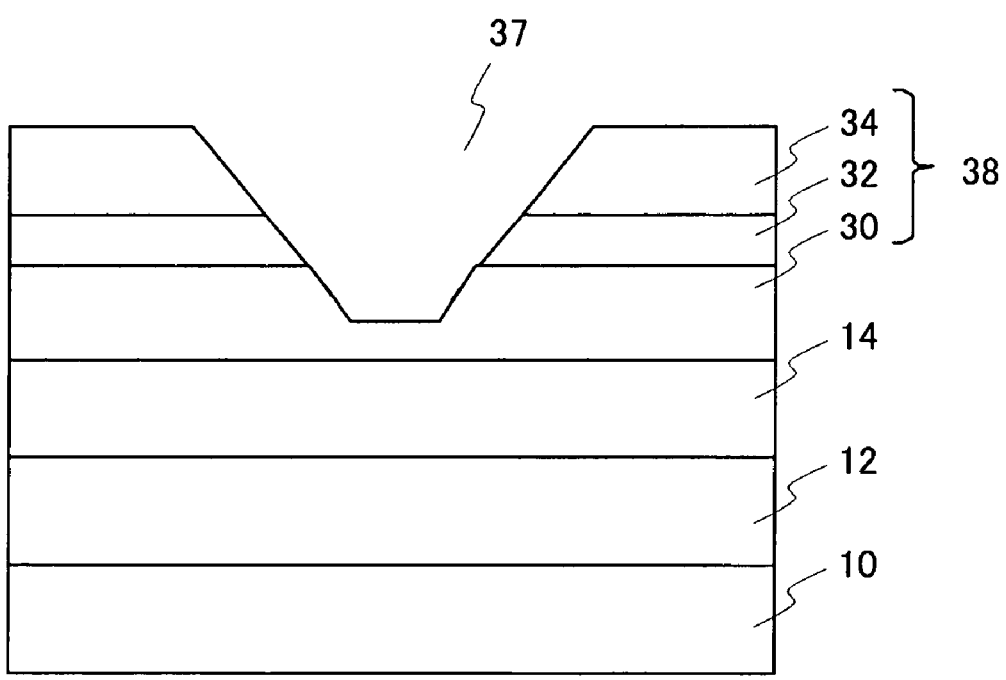
FIG. 11 is a cross-sectional view showing a fabrication process that follows the process shown in FIG. 10.

Referring to FIG. 11, the opening region 37 is formed by dry etching using a Cl$_2$ gas so that it is 250 nm deep and reaches the AlGaN drain layer 30. The open region 37 is essentially deeper than the channel layer 32. The side surface of the opening region 37 is inclined at an angle of approximately 60° with respect to the SiC substrate surface.

Figure 12:
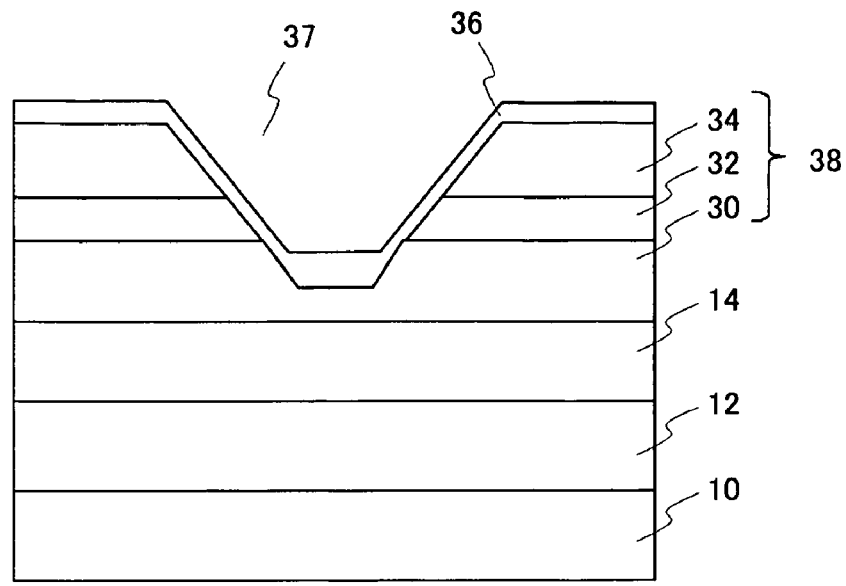
FIG. 12 is a cross-sectional view showing a fabrication process that follows the process shown in FIG. 11.

Referring to FIG. 12, the AlN cap layer 36 is formed to a thickness of 10 nm so as to cover the opening region 37. That is, the cap layer 36 having a wider band gap than that of the channel layer 32 is formed on the exposed side surface of the channel layer 32.

After given portions of the cap layer 36 are removed, the source electrodes 60 made of, for example, Ti/Al, are formed on the source layer 34. The gate electrode 66 made of, for example, Pt/Au, is formed on the cap layer 36 in the opening region 37. That is, the gate electrode 66 is provided above the side surface of the channel layer 32 in the opening region 37 through the cap layer 36. The substrate 10 is grinded to as to have a thickness of 100 µm, and the drain electrode made of, Ni/Al, is provided on the grinded backside of the SiC substrate 10. That is, the drain electrode 64 is connected to the surface of the draft layer 14 that opposes the GaN-based semiconductor layer 28 across the drift layer 14. The transistor shown in FIG. 8 can be fabricated by the above-mentioned manner.

In the second embodiment, the electrons from the source electrodes 60 passes through the source layer 34, and travels along the interface of the channel layer 32 with the cap layer 36. Then, the electrons pass through the drain layer 30, and flow through the drift layer 14 vertically. Finally, the electrons reach the drain electrode 64. The gate electrodes 62 control the flows of the electrodes so that the transistor operation can be achieved. The transistor of the second embodiment has a high breakdown capability because it has the SiC drift layer as in the case of the first embodiment. When the SiC drift layer 14 is 1 μm thick or more, the drain breakdown voltage can be improved. The transistor with the SiC drift layer 14 being 100 μm or less can be used practically. Further, the electrons travel along the interface of the channel layer 32 with the cap layer 36, so that the on-state resistance can be reduced.

Third Embodiment

Figure 13:
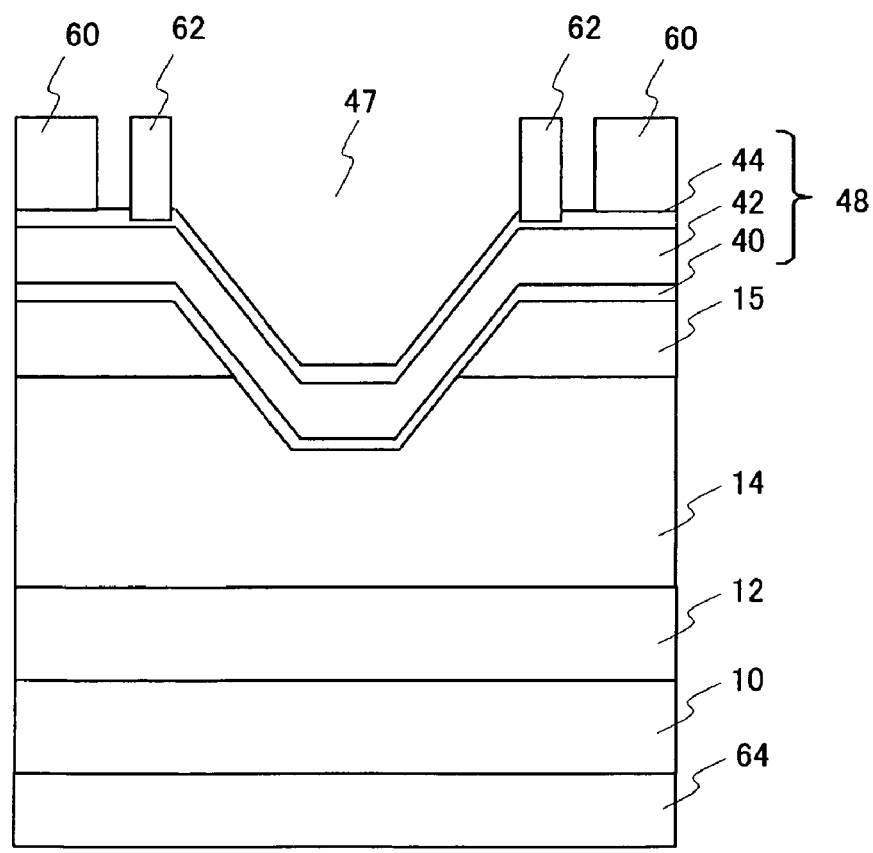
FIG. 13 is a cross-sectional view of a semiconductor device in accordance with a third embodiment of the present invention.
Figure 14:
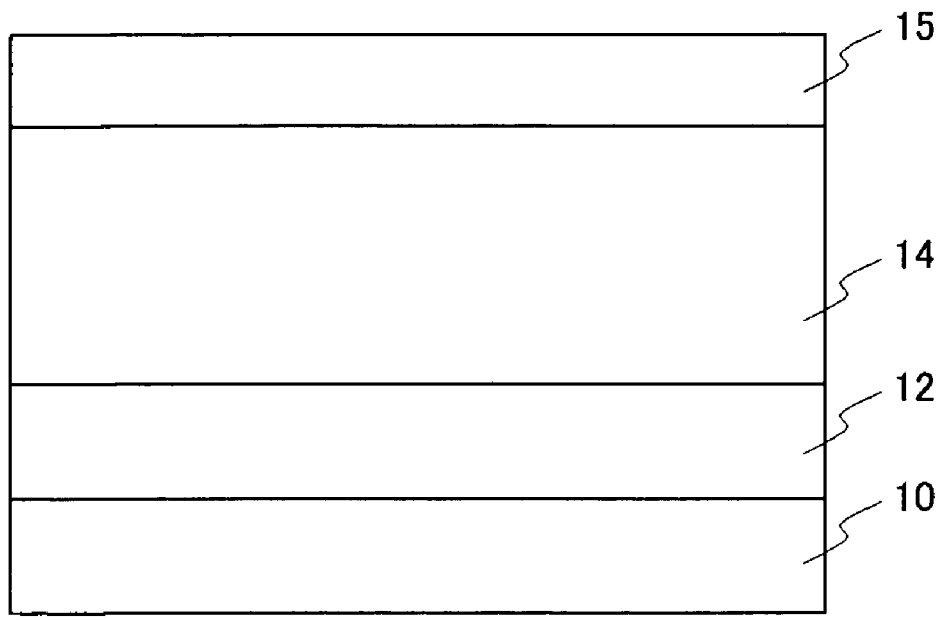
FIG. 14 is a cross-sectional view of a fabrication process of the semiconductor device in accordance with the third embodiment.

FIG. 13 is a cross-sectional view of a transistor in accordance with a third embodiment of the present invention. This transistor is a vertical FET (HEMT). The n-type SiC buffer layer 12, the n-type SiC drift layer 14 and the p-type SiC layer 15 are formed on the (0001) plane of the n-type SiC substrate 10 in this order. An opening region 47 is formed so as to be at least deeper than the p-type SiC layer 15. As a GaN-based semiconductor layer 48, an n-type AlGaN drain layer 40, a non-doped GaN channel layer 42 and an AlGaN source layer 44 are formed in this order. The GaN-based semiconductor layer 48 has a resultant opening region.

The source electrodes 60 are formed on the source layer 44, and the gate electrodes 62 are partially buried in the source layer 44. The drain electrode 64 is formed on the backside of the SiC substrate 10. That is, the drain electrode 64 is connected to the surface of the drift layer 14 that opposes the GaN-based semiconductor layer 48 across the drift layer 14.

FIGS. 14 through 17 are cross-sectional views that show a process of fabricating the transistor in accordance with the third embodiment. Referring to FIG. 13, the SiC buffer layer 12 and the SiC drift layer 14 are formed on the SiC substrate 10 in this order by CVD as in the case of the first embodiment. Next, the p-type SiC layer 15 having a p-type carrier concentration of $10 \times 10^{16}$ cm$^{-3}$ is formed to a film thickness of 100 nm by CVD.

Figure 15:
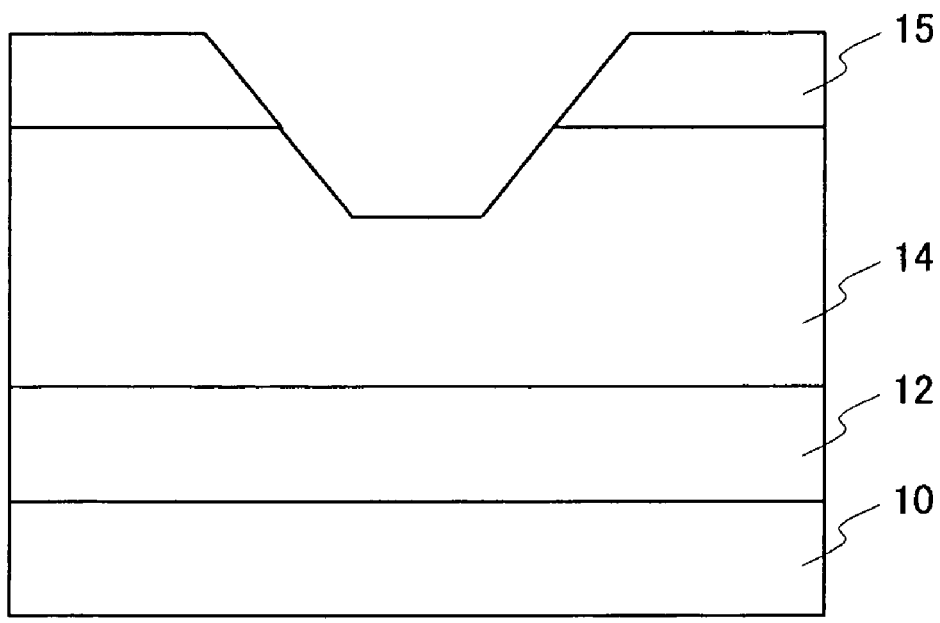
FIG. 15 is a cross-sectional view showing a fabrication process that follows the process shown in FIG. 14.

Referring to FIG. 15, the opening region 47 having a depth of 250 nm is formed in the drift layer 14 by dry etching with a Cl$_2$ gas. That is, the opening is formed so that the p-type SiC layer 15 is removed. The side surface of the opening region 37 is inclined at an angle of approximately 60° with respect to the SiC substrate surface.

Figure 16:
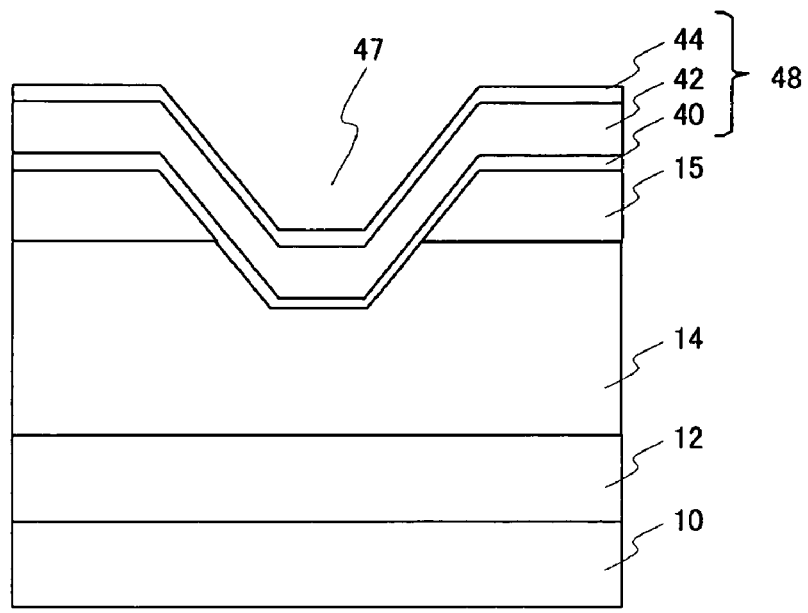
FIG. 16 is a cross-sectional view showing a fabrication process that follows the process shown in FIG. 15.

Referring to FIG. 16, the GaN-based semiconductor layer 48 is formed as follows. The n-type AlGaN layer 40 (having an AlN composition ratio of 0.09), which is a part of the GaN-based semiconductor layer 38, is formed on the drift layer 14 so that it has a film thickness of 20 nm and an n-type carrier concentration of $10 \times 10^{16}$ cm$^{-3}$ by, for example, MOCVD. The GaN channel layer 42, which is another part of the GaN-based semiconductor layer 38 and has no impurities implanted is grown to a film thickness of 500 nm on the AlGaN layer 40 by MOCVD. Further, the AlGaN cap layer 44 (having an AlN composition ratio of 0.25), which is yet another part of the GaN-based semiconductor layer 38 and has no impurities implanted, is grown to a film thickness of 20 nm on the GaN channel layer 42 by MOCVD.

Figure 17:
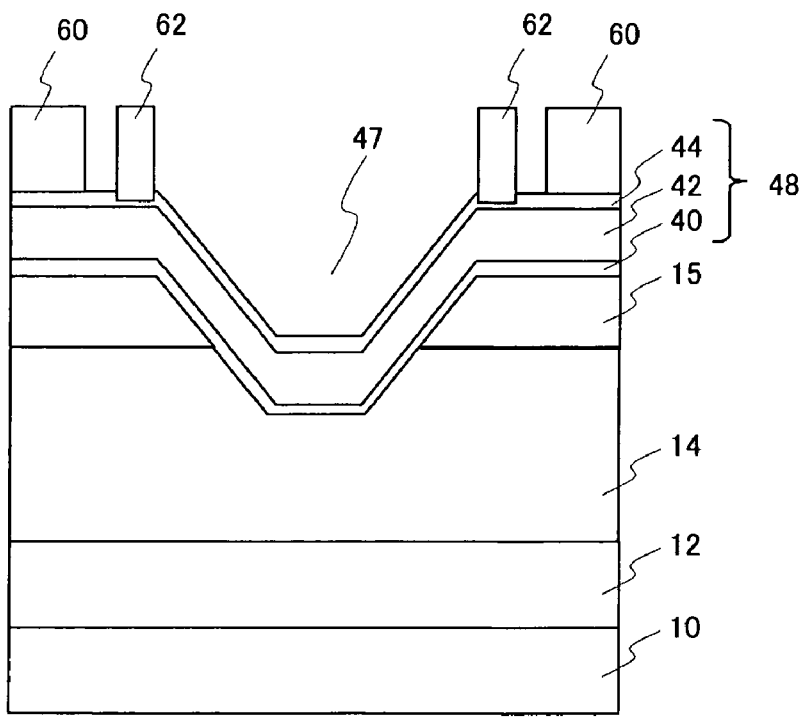
FIG. 17 is a cross-sectional view showing a fabrication process that follows the process shown in FIG. 16.

Referring to FIG. 17, given regions of the cap layer 44 are dry etched with a Cl$_2$ gas by 10 nm so as to form a recess. The source electrodes 60 made of, for example, Ti/Al, are formed at given positions on the cap layer 44, and the gate electrodes 62 made of Ni/Au are provided at given positions thereon.

The SiC substrate 10 is grinded so as to have a thickness of 100 μm, and the drain electrode 64 made of, for example, Ni/Al, is formed on the back surface of the SiC substrate 10.

The drain electrode 64 is connected to the surface of the drift layer 14 that opposes the GaN-based semiconductor layer 48 across the drift layer 14.

The p-type SiC layer 15 functions as a barrier that prevents electrons from directly flowing to the drain electrode 64 from the source electrodes 60. The p-type SiC layer 15 is in contact with the GaN-based semiconductor layer 48, so that the pinchoff characteristic can be improved.

The third embodiment employs the SiC drift layer 14 as the first and second embodiments, and has an improved breakdown capability. When the SiC drift layer 14 is 1 μm thick or more, the drain breakdown voltage can be improved. The transistor with the SiC drift layer 14 being 100 μm or less can be used practically. Further, the channel layer 42 is formed by the GaN-based semiconductor layer, so that the mobility and the on-state resistance can be improved.

Fourth Embodiment

Figure 18:
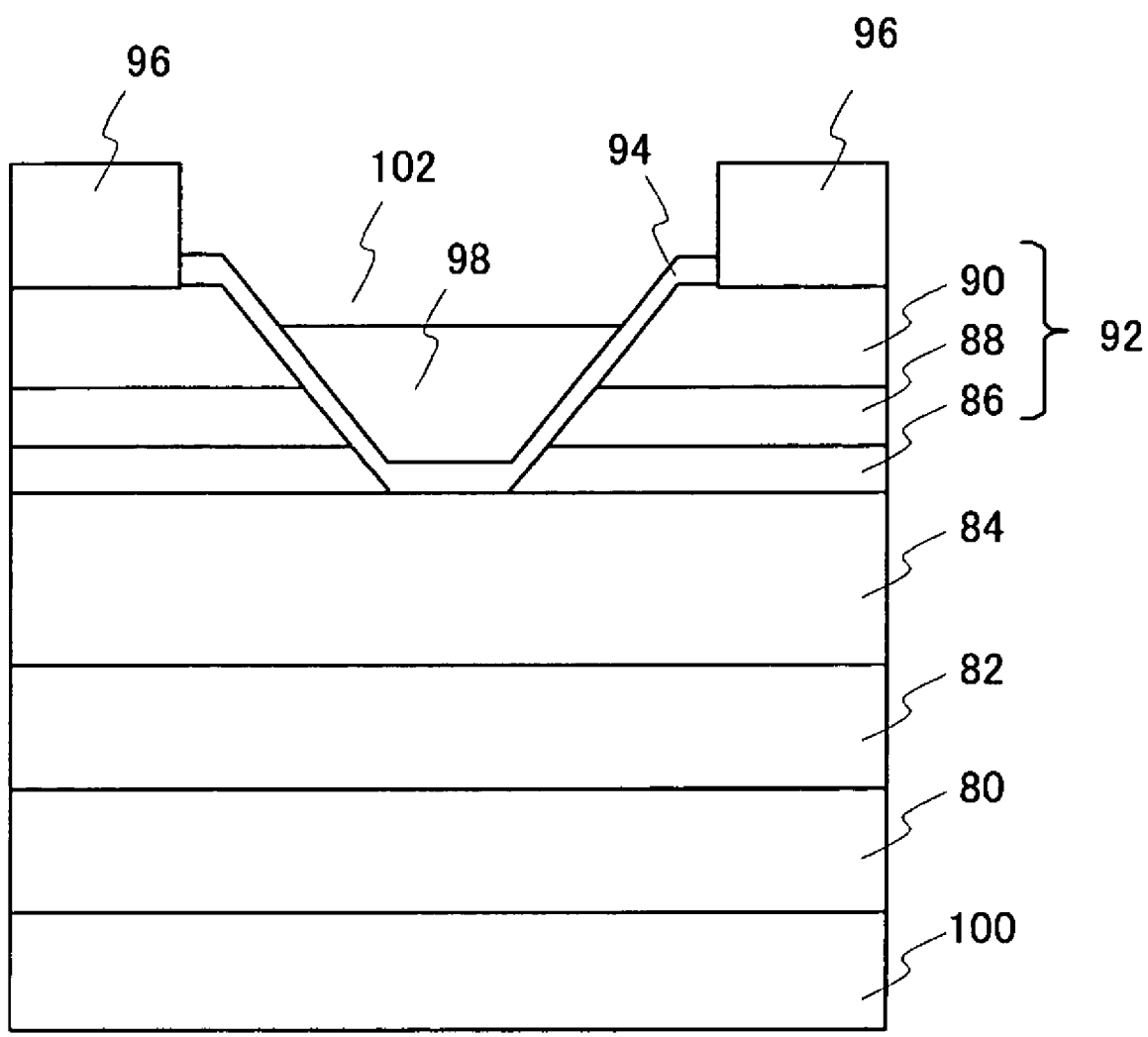
FIG. 18 is a cross-sectional view of a semiconductor device in accordance with a fourth embodiment of the present invention.

FIG. 18 is a cross-sectional view of a transistor in accordance with a fourth embodiment of the present invention. This transistor is an IGBT (Insulated Gate Bipolar Transistor) A p-type SiC buffer layer 82 and an n-type SiC drift layer 84 are formed on the (0001) plane of a p-type SiC substrate in this order. As a GaN-based semiconductor layer 92, an n-type GaN collector layer 86, a GaN channel layer 88 and a GaN emitter layer 90 are laminated in this order. An opening region 102 that reaches to the collector layer 86 from the device surface is formed.

An AlN gap layer 94 is formed so as to cover the opening region 102. A gate electrode 98 is formed on the cap layer 94, and emitter electrodes 96 are formed on the emitter layer 90, namely, the GaN-based semiconductor layer 92. The side surface of the channel layer 88 in the opening region 102 is equipped with the cap layer 94 having a wider band gap than that of the channel layer 88. The gate electrode 98 is formed above the side surface of the channel layer 88 in the opening region 102 through the cap layer 94. A collector electrode 100 is formed on the backside of the substrate 80. That is, the collector electrode 100 is connected to the surface of the drift layer 84 that opposes the GaN-based semiconductor layer 92 across the drift layer 84.

The IGBT of the fourth embodiment has the SiC drift layer 84 as the first through third embodiments, and has a high collector breakdown voltage. When the SiC drift layer 84 is 1 μm thick or more, the collector breakdown voltage can be improved. The transistor with the SiC drift layer 84 being 100 μm or less can be used practically. Further, the collector layer 86, the channel layer 88 and the emitter layer 90 are made of GaN-based semiconductors, so that the mobility and the on-state resistance can be improved.

In the first through fourth embodiments, the drain electrode 64 or the collector electrode 100 is formed on the backside of the substrate 10 or 80. It is essential to provide the drain electrode 64 or the collector electrode 100 connected to the surface of the drift layer 14, 84 opposite to the surface thereof to which the GaN-based semiconductor layers 28, 38, 48 and 92 are coupled. For example, an n-type SiC contact layer may be provided between the drift layer 14, 84 and the substrate 10, 80 in order to make the drain electrode or collector layer connected to the contact layer from the front (top) side of the device rather than the backside of the device. The substrate may be a silicon substrate instead of the SiC substrate. The use of the SiC or Si substrate realizes SiC layers having good crystallinity.

The channel layer is formed by a GaN-based semiconductor layer, which may be a crystalline layer made of at least one of GaN, AlN and InN or a mixed crystalline layer thereof. It is thus possible to realize transistors having lowered on-state resistance. The cap layer is formed by a GaN-based semiconductor layer having a wider band gap than that of the channel layer. It is thus possible to further reduce the on-state resistance.

The present invention is not limited to the specifically disclosed embodiments, and other embodiments, variations and modifications may be made without departing from the scope of the present invention.

What is claimed is:

1. A semiconductor device comprising:
a substrate;
a SiC drift layer formed on the substrate and having a thickness equal to or greater than 1 µm;
a GaN-based semiconductor layer that is formed on the SiC drift layer, and includes a channel layer and an opening region deeper than the channel layer;
a cap layer that is formed on a side surface of the channel layer in the opening region and has a band gap wider than that of the channel layer;
a gate electrode formed on the cap layer and located in the opening region;
a source or emitter electrode formed on the GaN-based semiconductor layer; and
a drain or collector electrode formed on a surface that opposes the SiC drift layer across the substrate,
wherein electrons between the source or emitter electrode and the drain or collector electrode flow through the SiC drift layer.

2. The semiconductor device as claimed in claim 1, wherein the GaN-based semiconductor layer includes a crystalline layer made of at least one of GaN, AlN and InN and a mixed crystalline layer thereof.

* * * * *